(12) United States Patent
Bruekers et al.

(10) Patent No.: US 7,225,136 B2
(45) Date of Patent: *May 29, 2007

(54) DATA COMPRESSION AND EXPANSION OF AN AUDIO SIGNAL

(75) Inventors: Alphons A. M. L. Bruekers, Eindhoven (NL); Arnoldus W. J. Oomen, Eindhoven (NL); Renatus J. Van Der Vleuten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 25 days.

This patent is subject to a terminal disclaimer.

(21) Appl. No.: 10/872,844

(22) Filed: Jun. 21, 2004

(65) Prior Publication Data

US 2004/0225496 A1    Nov. 11, 2004

(51) Int. Cl.
*H04B 1/66* (2006.01)
*G10L 19/04* (2006.01)

(52) U.S. Cl. .................. 704/500; 341/65; 341/143
(58) Field of Classification Search ................ 704/219, 704/500, 501, 502, 503, 504; 341/51, 65, 341/143; 375/244, 249
See application file for complete search history.

(56) References Cited

U.S. PATENT DOCUMENTS

| | | | | |
|---|---|---|---|---|
| 3,913,016 A | * | 10/1975 | Candy | 375/244 |
| 3,925,731 A | * | 12/1975 | Brainard et al. | 375/249 |
| 4,546,342 A | * | 10/1985 | Weaver et al. | 341/51 |
| 4,754,483 A | * | 6/1988 | Weaver | 704/203 |
| 5,023,611 A | * | 6/1991 | Chamzas et al. | 341/51 |
| 5,220,568 A | * | 6/1993 | Howe et al. | 714/782 |
| 5,224,087 A | * | 6/1993 | Maeda et al. | 369/53.12 |
| 5,323,396 A | | 6/1994 | Lokhoff | |
| 5,381,145 A | * | 1/1995 | Allen et al. | 341/107 |
| 5,530,655 A | | 6/1996 | Lokhoff et al. | |
| 5,539,829 A | | 7/1996 | Lokhoff et al. | |
| 5,606,618 A | | 2/1997 | Lokhoff et al. | |
| 5,742,930 A | * | 4/1998 | Howitt | 704/502 |
| 5,777,992 A | | 7/1998 | Lokhoff | |
| 6,269,338 B1 | * | 7/2001 | Bruekers et al. | 704/500 |
| 6,289,306 B1 | * | 9/2001 | Van Der Vleuten et al. | 704/219 |
| 6,535,845 B2 | * | 3/2003 | Van Der Vleuten et al. | 704/219 |
| 6,691,086 B2 | | 2/2004 | Lokhoff et al. | |
| 6,778,965 B1 | * | 8/2004 | Bruekers et al. | 704/500 |
| 7,107,212 B2 | * | 9/2006 | Van Der Vleuten et al. | 704/229 |

OTHER PUBLICATIONS

L. Risbo, "Improved Stability and Performance from Signal-Delta Modulators using 1-bit Vector Quantization," IEEE International Symposium on Circuits and Systems, 1993. ISCAS '93, May 3-6, 1993, pp. 1365 to 1368.*
Wikipedia, "Huffman coding", 6 pages, Jul. 20, 2006.*

\* cited by examiner

*Primary Examiner*—Martin Lerner

(57) ABSTRACT

A data compression apparatus for data compressing an audio signal includes an input terminal (1) for receiving the audio signal, a 1-bit A/D converter (4) for A/D converting the audio signal so as to obtain a bitstream signal, a lossless coder (10) for carrying out a lossless data compression step on the bitstream signal so as to obtain a data-compressed bitstream signal, and an output terminal (14) for supplying the data-compressed bitstream signal.

30 Claims, 3 Drawing Sheets

DATA COMPRESSION AND EXPANSION OF AN AUDIO SIGNAL

BACKGROUND OF THE INVENTION

1. Field of the Invention

The invention relates to a data compression apparatus for data compressing an audio signal, a data compression method, a transmitter comprising the data compression apparatus, a recording apparatus comprising the data compression apparatus, a record carrier having the data compressed audio signal recorded in a track of said record carrier, a data expansion apparatus for data expanding a data compressed audio signal, a data expansion method, a receiver comprising the data expansion apparatus and a reproducing apparatus comprising the data expansion apparatus.

2. Description of the Related Art

Data compression on an audio signal is well known in the art. Reference is made in this respect to European Patent Application No. EP-A 402,973, corresponding to U.S. Pat. Nos. 5,323,396; 5,530,655; 5,539,829; 5,606,618; 5,777,992; and 6,691,086. This patent describes a subband coder, in which an audio signal is A/D converted with a specific sampling frequency, such as 44.1 kHz, and the resulting samples, in the form of, e.g., 24-bit words of the audio signal, are supplied to a subband splitter filter. The subband splitter filter splits the wideband digital audio signal into a plurality of relatively narrow band subband signals. Using a psycho-acoustic model, a masked threshold is derived and blocks of samples of the subband signals are subsequently quantized with a specific number of bits per sample for each block of the subband signals in response to said masked threshold, resulting in a significant data compression of the audio signal to be transmitted. The data compression carried out is based on 'throwing away' those components in the audio signal that are inaudible and is thus a lossy compression method. The data compression described in the above patent is a rather intelligent data compression method and requires a substantial number of gates or instructions when realized in hard or software, respectively, so that it is expensive. Moreover, the subsequent expansion apparatus also requires a substantial number of gates or instructions, when realized in hardware or software, respectively.

SUMMARY OF THE INVENTION

It is an object of the invention to provide a data compression apparatus for data compressing an audio signal such that the data compression apparatus is more simple and that the corresponding expander apparatus can also be more simple and less expensive.

The data compression apparatus in accordance with the invention comprises input means for receiving the audio signal, conversion means for carrying out a conversion on the audio signal so as to obtain a 1-bit bitstream signal, the conversion means comprising sigma-delta modulator means, lossless coding means for carrying out a substantially lossless data compression step on the bitstream signal so as to obtain a data compressed bitstream signal, and output means for supplying the data compressed bitstream signal. More specifically, when the audio signal is an analog audio signal, the conversion means is in the form of A/D conversion means for carrying out a 1-bit A/D conversion on the analog audio signal so as to obtain said bitstream signal.

The invention is based on the following recognition. The audio signal can be applied in analog form or in digital form. When A/D converting, in accordance with the invention, an analog audio signal with a 1-bit A/D converter (also named: bitstream converter or sigma-delta modulator), the audio signal to be A/D converted is sampled with a frequency which is generally a multiplicity of the frequency 44.1 kHz or 48 kHz. The output signal of the 1-bit A/D converter is a binary signal, named bitstream signal. When the audio signal is supplied in digital form, sampled at, e.g., 44.1 kHz, the samples being expressed in, e.g., 16 bits per sample, this digital audio signal is oversampled with a frequency which is again a multiplicity of this sampling frequency of 44.1 kHz (or 48 kHz), which results in the 1-bit bitstream signal.

Converting an audio signal into a 1-bit bitstream signal has a number of advantages. Bitstream conversion is a high quality encoding method, with the possibility of a high quality decoding or a low quality decoding with the further advantage of a simpler decoding circuit. Reference is made in this respect to the publications 'A digital decimating filter for analog-to-digital conversion of hi-fi audio signals', by J. J. van der Kam, and 'A higher order topology for interpolative modulators for oversampling A/D converters', by Kirk C. H. Chao et al.

1-bit D/A converters are used in CD players, as an example, to reconvert the bitstream audio signal into an analog audio signal. The audio signal recorded on a CD disk is, however, not a data compressed 1-bit bitstream signal.

It is well known in the art that the resulting bitstream signal of the 1-bit A/D converter is, roughly said, a random signal which has a 'noisy-like' frequency spectrum. Such types of signals are hard to data compress.

Surprisingly, however, it was established that using a lossless coder, such as a variable length coder in the form of a Huffman coder or an arithmetic coder, a significant data reduction could be obtained, in spite of the noisy character of the bitstream signal from the 1-bit A/D converter.

BRIEF DESCRIPTION OF THE DRAWINGS

These and other aspects of the invention will be apparent from and elucidated further with reference to the embodiments described in the following figure description, in which.

DESCRIPTION OF THE PREFERRED EMBODIMENTS

Figure 1:
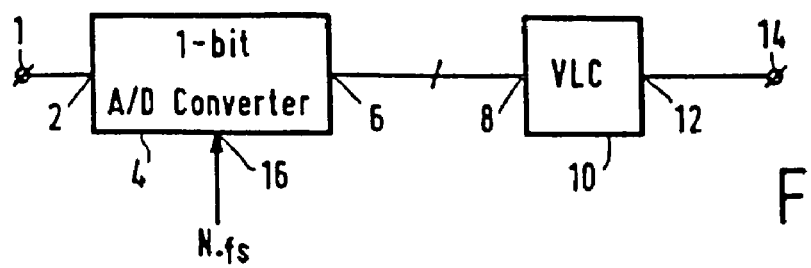
FIG. 1 shows an embodiment of the data compression apparatus.

FIG. 1 shows an embodiment of the data compression apparatus, comprising an input terminal 1 for receiving the audio signal. In the present example, the audio signal is an analog audio signal. The input terminal 1 is coupled to an input 2 of a 1-bit A/D converter 4, also called: sigma-delta modulator. An output 6 of the 1-bit A/D converter 4 is coupled to an input 8 of a data compression unit 10. An output 12 of the data compression unit 10 is coupled to an output terminal 14.

The 1-bit A/D converter 4 is adapted to carry out a 1-bit A/D conversion on the audio signal so as to obtain a bitstream signal which is supplied to the output 6. To that purpose, the A/D converter 4 receives a sampling frequency equal to $N \cdot f_S$ via an input 16. $f_S$ is a frequency equal to, e.g., 32 kHz, 44.1 kHz or 48 kHz, and N is a large number, such as 64. The audio signal is sampled in the A/D converter 4 with a sampling frequency of, e.g., 2.8224 MHz (64×44.1 kHz). The bitstream signal appearing at the output 6 of the A/D converter thus has a bit-rate of 2.8224 MHz.

The data compression unit 10 is in the form of a lossless coder. Lossless coders have the advantage that they can data compress the audio signal in such a way that, after data expansion by a lossless decoder, the original audio signal can be reconstructed in a substantially lossless way. That means that there is substantially no loss of information after compression-expansion. Lossless coders can be in the form of a variable-length coder. Variable-length coders are well known in the art. Examples of such variable-length coders are Huffman coders, arithmetic coders and Lempel-Ziv coders. Reference is made in this respect to the publications 'A method for the construction of minimum-redundancy codes' by D. A. Huffman, 'An introduction to arithmetic coding' by G. G. Langdon, and 'A universal algorithm for sequential data compression' by J. Ziv et al.

The data compression unit 10 carries out a substantially lossless data compression step on the bitstream signal so as to obtain a data compressed bitstream signal at its output 12, which is supplied to the output terminal 14.

Figure 2A:
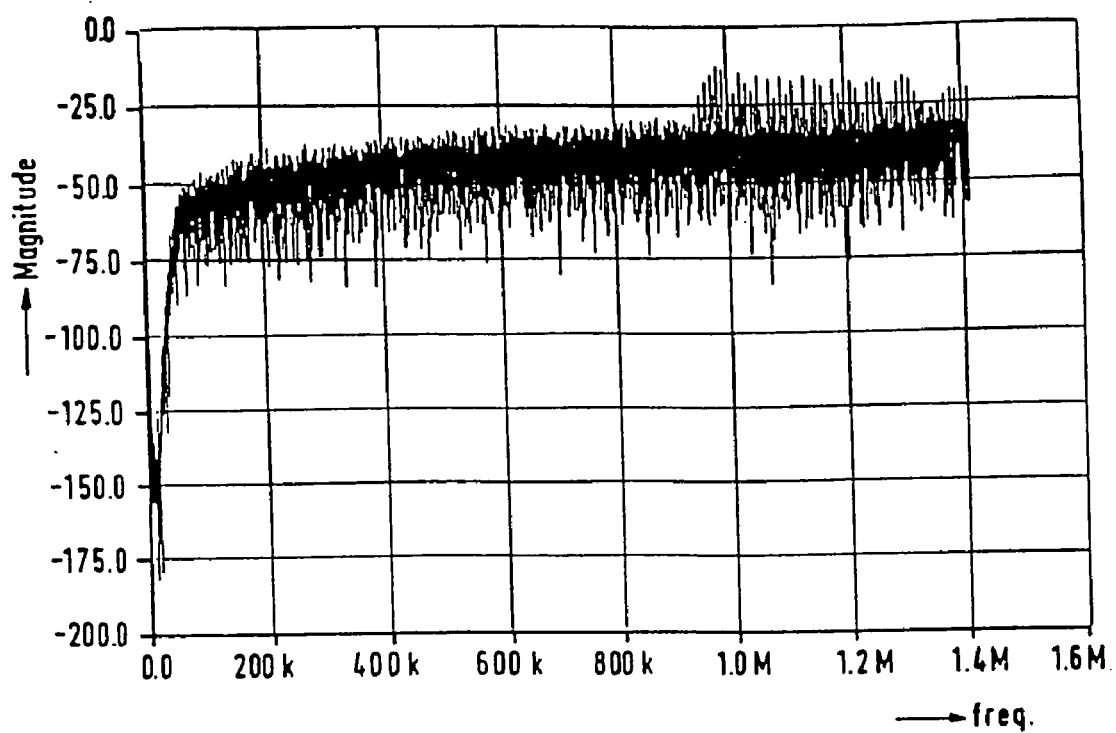
FIG. 2a shows the frequency spectrum of the output signal of the 1-bit A/D converter.
Figure 2B:
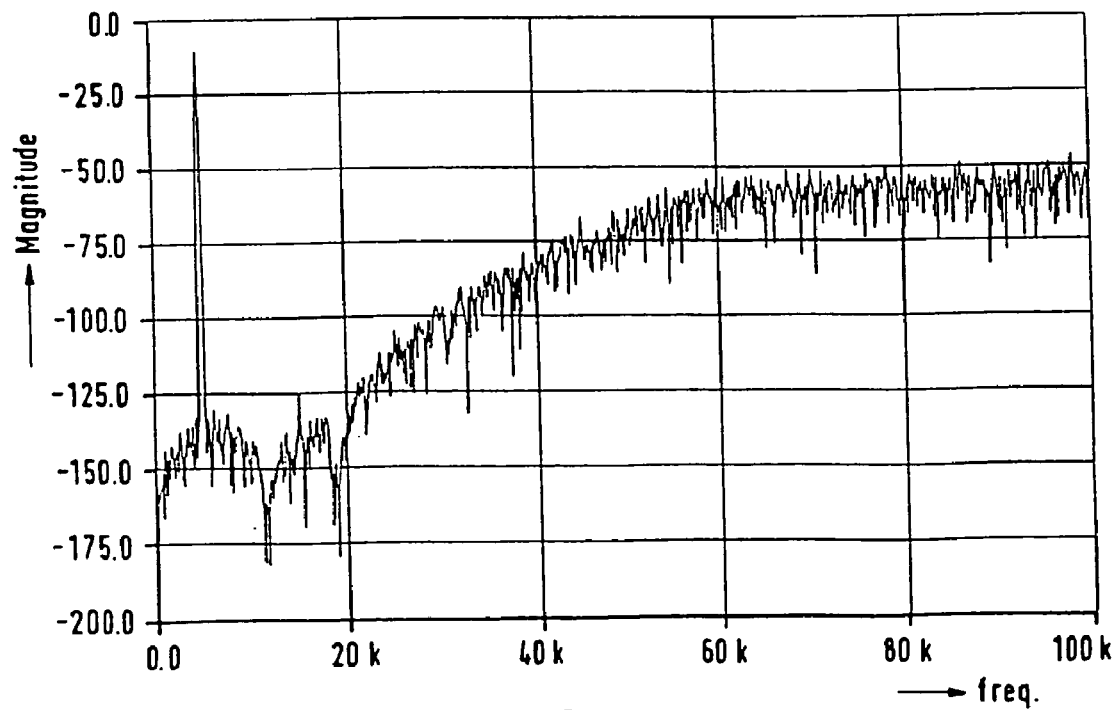
FIG. 2b shows the frequency spectrum of the same output signal in a smaller frequency range.

FIG. 2a shows a frequency spectrum of the bitstream signal present at the output 6 of the A/D converter 4, for an input signal in the form of a 5 kHz sinusoid, sampled with a sampling frequency of 2.8224 MHz. The spectrum thus shows frequencies between 0 Hz and 1.4 MHz. FIG. 2b shows part of the spectrum shown in FIG. 2a, namely, that part between 0 Hz and 100 kHz, so as to more clearly show the 5 kHz sinusoid comprised in the bitstream signal. Clearly visible is the noise-like character of the bitstream signal, especially in the higher frequency region, which seems to imply that carrying out data compression on the bitstream signal will not result in a substantial amount of data reduction.

Contrary to this, investigations have made clear that a significant data reduction can be obtained. In the following table, the results of the data compression realized by three lossless coders are given for three different music fragments:

| fragment | δ | | |
|---|---|---|---|
| | Huffman (8 b) | Hufmann (16 b) | Lempel-Ziv |
| bossanova | 1.31 | 1.45 | 1.73 |
| jazz | 1.35 | 1.50 | 1.77 |
| classical music | 1.38 | 1.59 | 1.86 | where δ is the compression ratio, defined as the ratio of the bit-rate of the input signal of the coder to the bit-rate of the output signal of the coder.

Figure 3:
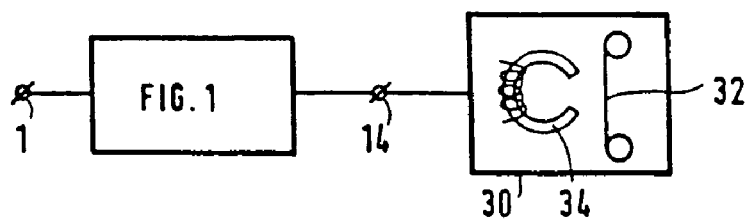
FIG. 3 shows the data compression apparatus incorporated in a recording apparatus for recording the data compressed bitstream signal on a record carrier.

FIG. 3 shows an embodiment of a recording apparatus comprising the data compression apparatus shown in FIG. 1. The recording apparatus further comprises a write unit 30 for writing the data-compressed bitstream signal in a track on the record carrier 32. In the present example, the record carrier 32 is a magnetic record carrier, so that the write unit 30 comprises at least one magnetic head 34 for writing the data-compressed bitstream signal in the record carrier 32. The record carrier may, however, be an optical record carrier, such as a CD disk or a DVD disk.

Figure 4:
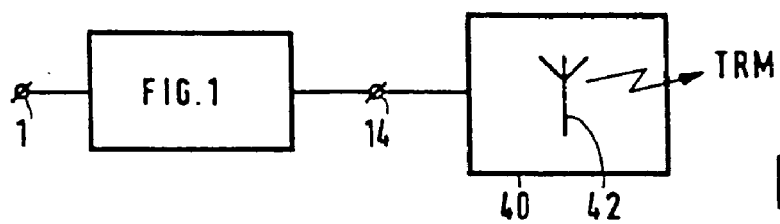
FIG. 4 shows the data compression apparatus incorporated in a transmission apparatus for transmitting the data compressed bitstream signal via a transmission medium.

FIG. 4 shows an embodiment of a transmitter for transmitting an audio signal via a transmission medium TRM, comprising the data compression apparatus as shown in FIG. 1. The transmitter further comprises a transmission unit 40 for applying the data-compressed bitstream signal to the transmission medium TRM. The transmission unit 40 could comprise an antenna 42.

Figure 8:
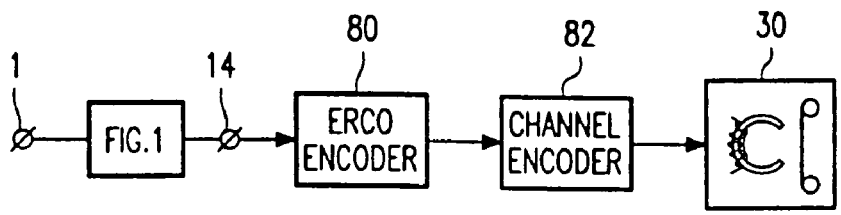
FIG. 8 shows a further embodiment of the recording apparatus further provided with an error correction encoder and a channel encoder.

Transmission via a transmission medium, such as a radio frequency link or a record carrier, generally requires an error correction encoding and a channel encoding carried out on the data-compressed bitstream signal to be transmitted. FIG. 8 shows such signal processing steps carried out on the data-compressed bitstream signal for the recording arrangement of FIG. 3. The recording arrangement of FIG. 8 therefore comprises an error correction encoder 80, well known in the art, and a channel encoder 82, also well known in the art.

Figure 5:
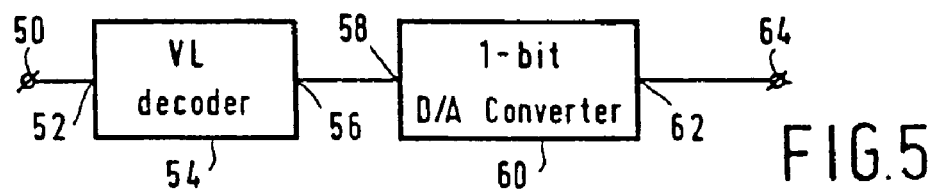
FIG. 5 shows an embodiment of the data expansion apparatus.

FIG. 5 shows an embodiment of the data expansion apparatus. The apparatus has an input terminal 50 for receiving the data-compressed audio signal which is in the form of the data-compressed bitstream signal, as supplied by the data compression apparatus of FIG. 1. The input terminal 50 is coupled to an input 52 of a data expansion unit 54, which has an output 56 coupled to an input 58 of a 1-bit D/A converter 60. An output 62 of the converter 60 is coupled to an output terminal 64.

The data expansion unit 54 is a lossless decoder, such as a variable-length decoder in the form of, e.g., a Huffman decoder or an arithmetic decoder. It will be clear that the decoder in the data expansion apparatus of FIG. 5 should be the inverse of the encoder used in the data compression apparatus of FIG. 1, in order to realize a substantially lossless encoding-decoding step. The data expansion unit 54 expands the data-compressed bitstream so as to obtain a replica of the original bitstream, which is supplied to the input 58 of the D/A converter 60. The converter 60 converts the bitstream into an analog audio signal which is supplied to the terminal 64.

Figure 6:
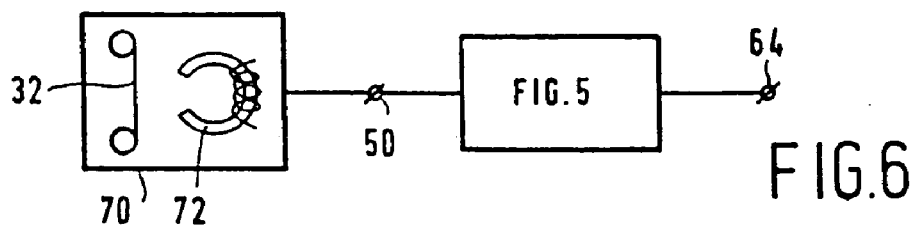
FIG. 6 shows the data expansion apparatus incorporated in a reproducing apparatus for reproducing the data compressed bitstream signal from a record carrier.

FIG. 6 shows the data expansion apparatus of FIG. 5 incorporated in a reproduction apparatus. The reproducing apparatus further comprises a read unit 70 for reading the data-compressed bitstream signal from a track on the record carrier 32. In the present example, the record carrier 32 is a magnetic record carrier, so that the read unit 70 comprises at least one magnetic head 72 for reading the data-compressed bitstream signal from the record carrier 32. The record carrier may, however, be an optical record carrier, such as a CD disk or a DVD disk.

Figure 7:
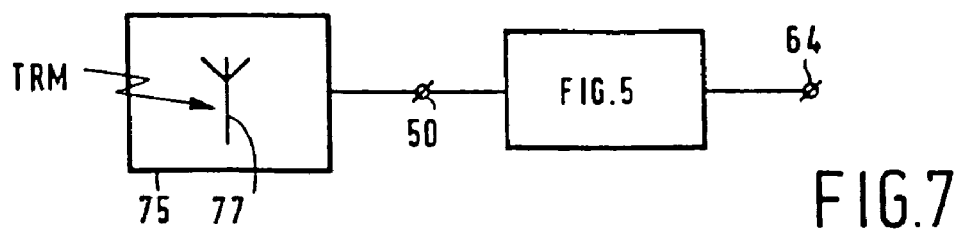
FIG. 7 shows the data expansion apparatus incorporated in a receiving apparatus for receiving the data compressed bitstream signal from a transmission medium.

FIG. 7 shows an embodiment of a receiver for receiving an audio signal via a transmission medium TRM, comprising the data expansion apparatus as shown in FIG. 5. The receiver further comprises a receiving unit 75 for receiving the data-compressed bitstream signal from the transmission medium TRM. The receiving unit 75 could comprise an antenna 77.

Figure 9:
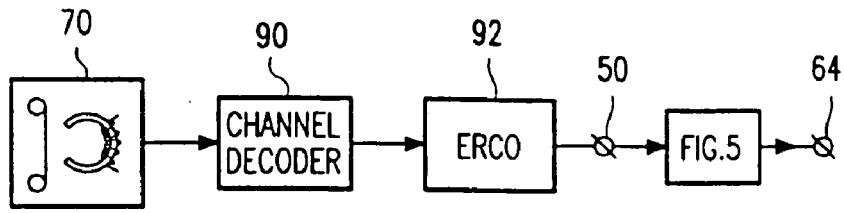
FIG. 9 shows a further embodiment of the reproducing apparatus further provided with a channel decoder and an error correction unit.

As has been explained above, transmission via a transmission medium, such as a radio frequency link or a record carrier, generally requires error correction encoding and channel encoding to be carried out on the data-compressed bitstream signal to be transmitted, so that a corresponding channel decoding and error correction can be carried out upon reception. FIG. 9 shows the signal processing steps of channel decoding and error correction carried out on the received signal, received by the reading means 70 for the reproducing arrangement of FIG. 6. The reproducing arrangement of FIG. 9 therefore comprises a channel decoder 90, well known in the art, and an error correction unit 92, also well known in the art, so as to obtain a replica of the data-compressed bitstream signal.

Figure 10:
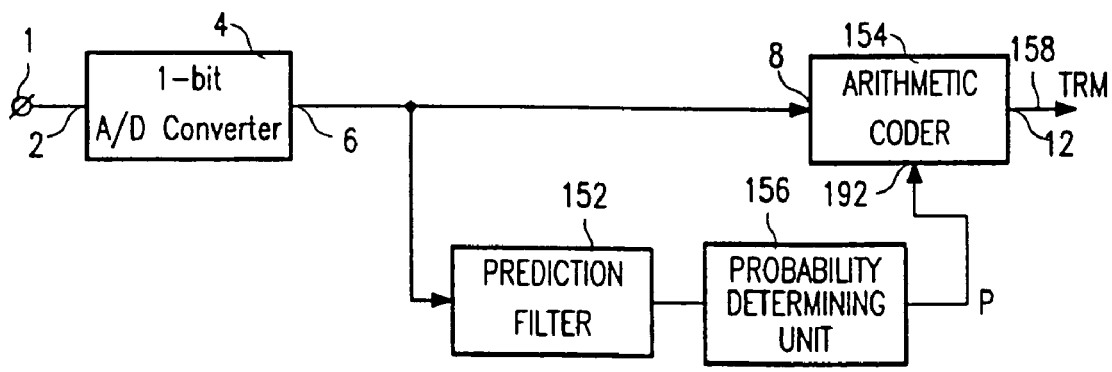
FIG. 10 shows an embodiment of the data compression apparatus in which the lossless coder is in the form of an arithmetic coder.

Another data compression apparatus is shown in FIG. 10. In the data compression apparatus of FIG. 10, the bitstream signal is supplied to an input 8 of a lossless coder, which is in the form of an entropy coder, such as an arithmetic coder 154. Further the bitstream signal is also an input of a prediction filter unit 152. An output of the prediction filter unit 152 is coupled to an input of a probability determining unit 156. The arithmetic coder 154 encodes the bitstream signal into a data-compressed bitstream signal in response to probability values p supplied to its input 192. The probability determining unit 156 determines a probability value indicating the probability that a bit in the bitstream signal supplied by the converter unit 4 has a predetermined logical value, such as '1'. This probability value, denoted p in FIG. 10, is supplied to the arithmetic coder 154 so as to enable the data compression of the bitstream signal in the arithmetic coder 154. The determining unit 156 determines this probability value from the output signal of the prediction filter 152. The arithmetic coder 154 can data compress the bitstream signal on a frame-by-frame basis.

The functioning of the apparatus of FIG. 10 is as follows. The prediction filter 152 realizes a prediction filtering on the bitstream signal so as to obtain a multi-bit output signal. The multi-bit output signal has a plurality of levels within a range of, e.g., +3 and −3. Further, for each of a plurality of subintervals in the value range of the multi-bit output signal, it is determined what the probability is that the corresponding bit in the bitstream signal is, e.g., a '1' bit. This can be realized by counting the number of 'ones' and 'zeroes' occurring in the bitstream signal during a specific time interval, when the multi-bit output signal falls in one of such ranges. The probabilities thus obtained for the various values in the multi-bit output signal are subsequently supplied as the probability signal p to the arithmetic coder 154. The data-compressed bitstream signal is supplied by the arithmetic coder 154 to an output line 158, for transmission via a transmission medium TRM or a record carrier.

Figure 11:
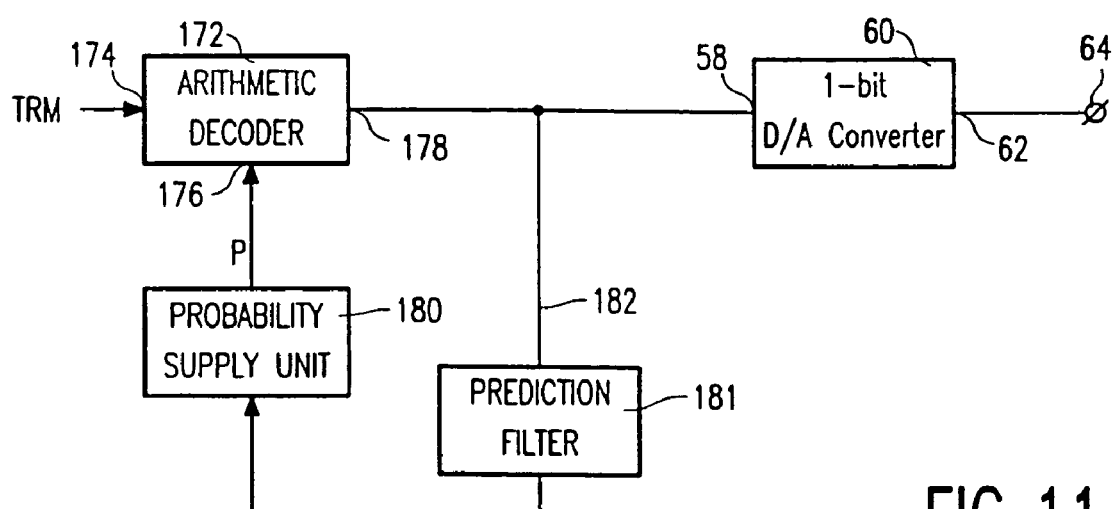
FIG. 11 shows an embodiment of the data expansion apparatus in which the lossless decoder is in the form of an arithmetic decoder.

FIG. 11 shows a corresponding data expansion apparatus for decoding the data-compressed bitstream signal, received via the transmission medium TRM. The data processing apparatus of FIG. 11 comprises an entropy decoder 172, which receives the data-compressed bitstream signal via an input 174. In the present example, the entropy decoder 172 is in the form of an arithmetic decoder that carries out an arithmetic decoding step on the data-compressed bitstream signal under the influence of a probability signal p, supplied to an input 176 so as to generate a replica of the original bitstream signal which is supplied to an output 178. The replica is supplied to an input 58 of the reconverter unit 60.

Further, a probability supply unit 180 is present for supplying the probability signal p to the arithmetic decoder 172. The probability signal p can be obtained in different ways, dependent on how the probability signal had been derived in the encoder. One way is to derive the probability signal p in an adaptive way from the output signal of a prediction filter 181. In this embodiment, the prediction filter 181 is equivalent to the prediction filter 152 in the encoder and the probability supply unit 180 is equivalent to the probability determining unit 156 in the encoder of FIG. 10. Another way of generating the probability signal p is by using side information received via the transmission medium TRM, as will be explained hereafter.

Side information can be generated by the apparatus of FIG. 10 for transmission to the apparatus of FIG. 11. Such side information can include the filter coefficients for the filter 152 that are determined on a frame-by-frame basis, these coefficients being transmitted to the corresponding prediction filter included in the unit 180.

Further, the apparatus of FIG. 10 can generate parameters that describe the conversion of the multi-bit output signal of the prediction filter 152 into the probability signal p. Such parameters are also included in the side information and transmitted to the supply unit 180 and the filter 181, so as to enable the regeneration of the probability signal p in the apparatus of FIG. 11 on the basis of the multi-bit output signal provided by the prediction filter 181.

The entropy encoder used in the embodiment of FIG. 10 is adapted to encode the bitstream signal using a probability signal in order to obtain the data-compressed bitstream signal. One such entropy encoder is the arithmetic coder described above. One other type of such entropy coder is, as an example, the well-known finite state coder. The entropy decoder used in the embodiment of FIG. 11 is adapted to decode the data-compressed bitstream signal using a probability signal in order to obtain a replica of the bitstream signal. One such entropy decoder is the arithmetic decoder described above. One other type of such entropy decoder is, as an example, the well-known finite state decoder.

While the invention has been described with reference to preferred embodiments thereof, it is to be understood that these are not limitative examples. Thus, various modifications may become apparent to those skilled in the art, without departing from the scope of the invention, as defined by the claims. When the audio signal is supplied in digital form, such as sampled at 44.1 kHz, and the samples being expressed in, e.g., 16 bits, the conversion means is adapted to oversample the digital audio signal with, e.g., the frequency of 64×44.1 kHz so as to obtain the 1-bit bitstream signal.

It should further be noted that the invention also applies to an embodiment in which the bitstream signal, as supplied by the converter 4, has undergone an additional signal processing step resulting in a processed 1-bit bitstream signal that is supplied to the lossless coder 10. Such additional signal processing step could include merging a left and right hand signal component of a stereo audio signal, in 1-bit bitstream form, into a processed 1-bit bitstream signal.

Further, the invention lies in each and every novel feature or combination of features.

What is claimed is:

1. A data compression apparatus for data compressing an audio signal, the data compression apparatus consisting essentially of:
   input means for receiving the audio signal;
   conversion means for carrying out a conversion on the audio signal to form a 1-bit bitstream signal;
   lossless coding means for carrying out a substantially lossless data compression step on the 1-bit bitstream signal to form a data-compressed bitstream signal; and
   output means for supplying the data-compressed bitstream signal.

2. The data compression apparatus as claimed in claim 1, wherein the audio signal is an analog audio signal, and the conversion means comprises analog-to-digital (A/D) conversion means for carrying out a 1-bit A/D conversion on the analog audio signal to form said 1-bit bitstream signal.

3. The data compression apparatus as claimed in claim 1, wherein the lossless coding means comprises a variable-length coder.

4. The data compression apparatus as claimed in claim 3, wherein the variable-length coder is a Huffman coder.

5. The data compression apparatus as claimed in claim 3, wherein the variable-length coder is an arithmetic coder.

6. A transmitter for transmitting an audio signal via a transmission medium, comprising the data compression apparatus as claimed in claim 1, wherein the transmitter further comprises:
   transmission means for applying the data-compressed bitstream signal to the transmission medium.

7. The transmitter as claimed in claim 6, wherein the transmitter further comprises:
   error correction encoding means and channel encoding means, for error correction encoding and channel encoding the data-compressed bitstream signal prior to applying the data-compressed bitstream signal to the transmission medium.

8. A recording apparatus for recording an audio signal on a record carrier, comprising the data compression apparatus as claimed in claim 1, wherein the recording apparatus further comprises:
   writing means for writing the data-compressed bitstream signal on the record carrier.

9. The recording apparatus as claimed in claim 8, wherein the record carrier is an optical or a magnetic record carrier.

10. The transmitter as claimed in claim 8, wherein the transmitter further comprises:
    error correction encoding means and channel encoding means, for error correction encoding and channel encoding the data-compressed bitstream signal prior to writing the data-compressed bitstream signal on the record carrier.

11. A data compression method for data compressing an audio signal, the data compression method consisting essentially of the steps of:
    receiving the audio signal;
    converting the audio signal to form a 1-bit bitstream signal;
    carrying out a substantially lossless data compression step on the 1-bit bitstream signal to form a data-compressed bitstream signal; and
    supplying the data-compressed bitstream signal.

12. Record carrier having a data-compressed bitstream signal recorded on said record carrier, said data-compressed bitstream signal having originated from an audio signal subjected to the process consisting essentially of:
    converting the audio signal to form a 1-bit bitstream signal;
    carrying out a substantially lossless data compression step on the 1-bit bitstream signal to form a data-compressed bitstream signal; and
    supplying the data-compressed bitstream signal.

13. A data expansion apparatus for data expanding a data-compressed audio signal to form a replica of an original audio signal, the data expansion apparatus consisting essentially of:
    input means for receiving the data-compressed audio signal in the form of a data-compressed 1-bit bitstream signal;
    lossless decoding means for carrying out a substantially lossless data expansion step on the data-compressed 1-bit bitstream signal to form a 1-bit bitstream signal;
    digital-to-analog (D/A) conversion means for carrying out a D/A conversion on the 1-bit bitstream signal to form the replica of the original audio signal; and
    output means for supplying the replica of the original audio signal.

14. The data expansion apparatus as claimed in claim 13, wherein the D/A conversion means comprises a sigma-delta demodulator.

15. The data expansion apparatus as claimed in claim 13, wherein the lossless decoding means comprises a variable-length decoder.

16. The data expansion apparatus as claimed in claim 15, wherein the variable-length decoder is a Huffman decoder.

17. The data expansion apparatus as claimed in claim 15, wherein the variable-length decoder is an arithmetic decoder.

18. A receiver for receiving an audio signal via a transmission medium, comprising the data expansion apparatus as claimed in claim 13, wherein the receiver further comprises:
    receiving means for retrieving the data-compressed 1-bit bitstream signal from the transmission medium.

19. The receiver as claimed in claim 18, wherein the receiver further comprises:
    channel decoding means and error correction means, for channel decoding and error correcting the signal retrieved from the transmission medium to form said data-compressed bitstream signal.

20. A reproducing apparatus for reproducing an audio signal from a record carrier, comprising the data expansion apparatus as claimed in claim 13, wherein the reproducing apparatus further comprises:
    reading means for reading the data-compressed 1-bit bitstream signal from the record carrier.

21. The reproducing apparatus as claimed in claim 20, wherein the reproducing apparatus further comprises:
    channel decoding means and error correction means, for channel decoding and correcting the signal read from the record carrier to form said data-compressed bitstream signal.

22. A data expansion method for data expanding a data-compressed audio signal to form a replica of an original audio signal, the data expansion method consisting essentially of the steps of:
    receiving the data-compressed audio signal in the form of a data-compressed 1-bit bitstream signal;

carrying out a substantially lossless data expansion step on the data-compressed 1-bit bitstream signal to form a 1-bit bitstream signal;

carrying out a digital-to-analog (D/A) conversion on the 1-bit bitstream signal to form the replica of the original audio signal; and supplying the replica of the original audio signal.

23. A data compression apparatus for data compressing an audio signal, the data compression apparatus consisting essentially of:

input means for receiving the audio signal;

conversion means for carrying out a conversion on the audio signal to form a 1-bit bitstream signal;

lossless coding means for carrying out a substantially lossless data compression step on the 1-bit bitstream signal to form a data-compressed bitstream signal; and output means for supplying the data-compressed bitstream signal, Wherein said lossless compression means comprises:

an entropy encoder for entropy encoding the 1-bit bitstream signal in response to a probability signal to form said data-compressed bitstream signal;

prediction means for carrying out a prediction step on the bitstream signal; and probability signal determining means for determining said probability signal from an output of said prediction means.

24. The data compression apparatus as claimed in claim 23, wherein the prediction means comprises prediction filter means for carrying out a prediction filter operation on the bitstream signal to form a multi-value output signal, and wherein said probability determining means derives said probability signal from said multi-value output signal.

25. A data compression method for data compressing an audio signal, the data compression method consisting essentially of the steps of:

receiving the audio signal;

converting the audio signal to obtain a 1-bit bitstream signal;

carrying out a substantially lossless data compression step on the 1-bit bitstream signal to form a data-compressed bitstream signal; and supplying the data-compressed bitstream signal, wherein said lossless compression step comprises the sub-steps of:

entropy encoding the bitstream signal in response to a probability signal to form said data-compressed bitstream signal;

carrying out a prediction step on the bitstream signal; and determining said probability signal from a result of said prediction step.

26. The data compression method as claimed in claim 25, wherein the prediction step comprises the sub-step of:

carrying out a prediction filter operation on the bitstream signal to form a multi-value output signal, and wherein said probability determining step comprises the sub-step of:

deriving said probability signal from said multi-value output signal.

27. A data expansion apparatus for data expanding a data-compressed audio signal to form a replica of an original audio signal, the data expansion apparatus consisting essentially of:

input means for receiving the data-compressed audio signal in the form of a data-compressed 1-bit bitstream signal;

lossless decoding means for carrying out a substantially lossless data expansion step on the data-compressed 1-bit bitstream signal to form a 1-bit bitstream signal;

digital-to-analog (D/A) conversion means for carrying out a D/A conversion on the 1-bit bitstream signal to form the replica of the original audio signal; and output means for supplying the replica of the original audio signal, wherein said lossless decoding means comprises:

an entropy decoder for entropy decoding the data-compressed 1-bit bitstream signal in response to a probability signal to obtain said 1-bit bitstream signal; and probability signal generator means for supplying said probability signal.

28. The data expansion apparatus as claimed in claim 27, wherein said entropy decoder is an arithmetic decoder.

29. A data expansion method for data expanding a data-compressed audio signal to form a replica of an original audio signal, the data expansion method consisting essentially of the steps of:

receiving the data-compressed audio signal in the form of a data-compressed 1-bit bitstream signal;

carrying out a substantially lossless data expansion step on the data-compressed 1-bit bitstream signal to form a 1-bit bitstream signal;

carrying out a digital-to-analog (D/A) conversion on 1-bit the bitstream signal to form the replica of the original audio signal; and supplying the replica of the original audio signal, wherein said lossless data expansion step comprises the sub-steps of:

entropy decoding the data-compressed 1-bit bitstream signal in response to a probability signal to obtain said 1-bit bitstream signal; and supplying said probability signal.

30. The data expansion method as claimed in claim 29, wherein said entropy decoding step comprises an arithmetic decoding step.

* * * * *